United States Patent
Lee

(10) Patent No.: US 11,143,921 B2
(45) Date of Patent: Oct. 12, 2021

(54) DISPLAY DEVICE

(71) Applicant: LG Display Co., Ltd., Seoul (KR)

(72) Inventor: Jin-Uk Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/712,372

(22) Filed: Dec. 12, 2019

(65) Prior Publication Data

US 2020/0192140 A1   Jun. 18, 2020

(30) Foreign Application Priority Data

Dec. 14, 2018 (KR) .................. 10-2018-0161904

(51) Int. Cl.
| | |
|---|---|
| *G02F 1/1339* | (2006.01) |
| *H01L 27/32* | (2006.01) |
| *H01L 51/52* | (2006.01) |
| *G02F 1/1362* | (2006.01) |
| *G02F 1/1333* | (2006.01) |
| *G06F 3/041* | (2006.01) |
| *G02F 1/1368* | (2006.01) |

(52) U.S. Cl.
CPC ........ *G02F 1/13394* (2013.01); *G02F 1/1368* (2013.01); *G02F 1/13338* (2013.01); *G02F 1/136209* (2013.01); *G06F 3/04186* (2019.05); *H01L 27/322* (2013.01); *H01L 27/323* (2013.01); *H01L 27/3251* (2013.01); *H01L 51/5246* (2013.01); *G02F 1/133357* (2021.01); *G02F 1/136222* (2021.01)

(58) Field of Classification Search
CPC ............. G02F 1/133512; G02F 1/1339; G02F 1/13394; G02F 1/13338; G02F 2001/13396; H01L 51/525; H01L 51/5246; H01L 27/323; G06F 3/04186
See application file for complete search history.

(56) References Cited

U.S. PATENT DOCUMENTS

| | | | |
|---|---|---|---|
| 2011/0310336 A1* | 12/2011 | Kobayashi | .......... G02F 1/13394 |
| | | | 349/106 |
| 2015/0053956 A1* | 2/2015 | Sato | ..................... H01L 51/5246 |
| | | | 257/40 |
| 2016/0370629 A1* | 12/2016 | Chuang | ................. G02F 1/1339 |
| 2018/0299724 A1* | 10/2018 | Gu | .................... G02F 1/133514 |

FOREIGN PATENT DOCUMENTS

KR   10-2014-0113700 A   9/2014

* cited by examiner

*Primary Examiner* — Angela K Davison
(74) *Attorney, Agent, or Firm* — Seed IP Law Group LLP

(57) ABSTRACT

Disclosed is a liquid crystal display device including: a first substrate provided with an active area where an image is displayed, and with a nonactive area where an image is not displayed; a second substrate provided with a thin film transistor, and arranged to face the first substrate; a liquid crystal material disposed between the first substrate and the second substrate; a sealing member sealing between the first substrate and the second substrate; and a sealing area cell gap maintenance portion provided in a sealing area mutually sealing the first substrate and the second substrate to maintain a sealing area cell gap, which is an internal thickness of the first substrate and the second substrate in the sealing area SA, uniformly with an active area cell gap, which is an internal thickness of the first substrate and the second substrate in the active area.

11 Claims, 8 Drawing Sheets

DISPLAY DEVICE

CROSS REFERENCE TO RELATED APPLICATION

The present application claims priority to Korean Patent Application No. 10-2018-0161904, filed on Dec. 14, 2018, the entire contents of which is incorporated herein for all purposes by this reference.

BACKGROUND

Technical Field

The present disclosure relates generally to a display device. More particularly, the present disclosure relates to a display device, which uniformly maintains an active area cell gap that is an internal thickness of an active area where an image is displayed, and a sealing area cell gap that is an internal thickness of a sealing area.

Description of the Related Art

Display devices can be manufactured to have a thin thickness as well as be operated with low power consumption therefore, they are widely used in the display industry.

As a kind of display devices, liquid crystal display devices are driven by using the optical anisotropy and polarization properties of liquid crystals. Since such a liquid crystal has a long and thin structure, it has a directionality in the arrangement of molecules, and it is possible to artificially control the direction of the molecular arrangement by applying an electric field to the liquid crystal. Accordingly, when the direction of the molecular alignment of the liquid crystal is adjusted, the molecular arrangement of the liquid crystal is changed, and light is refracted in the molecular alignment direction of the liquid crystal due to optical anisotropy, thereby displaying image information.

In general, a display device comprises: a first substrate provided with an active area in which an image is displayed, and with a nonactive area in which an image is not displayed; a second substrate provided with a thin film transistor; and a pixel image layer with the above-mentioned properties interposed between the first substrate and the second substrate. As an example, the pixel image layer comprises a liquid crystal in case the display device is a liquid crystal display device.

A display device implements a desired image by forming an electric field between two substrates and adjusting the intensity of the electric field to control the amount of light incident from the back surface. Therefore, the uniformity of the cell gap, which is the internal thickness of the display device, has a great influence on the image quality, so the cell gap of the display device is designed to always maintain a constant width.

However, a conventional display device is problematic in that when the first substrate and the second substrate are sealed using a sealing member, cell gaps, between a sealing area where the first substrate and the second substrate are sealed, an active area where an image is displayed, and a nonactive area where an image is not displayed, are not maintained uniformly.

DOCUMENTS OF RELATED ART (Patent Document 1) Korean Patent Application Publication No. 10-2014-0113700 (Toyobo Kabushiki Kaisha), 2014 Sep. 24.

BRIEF SUMMARY

Accordingly, the present disclosure is intended to propose a display device, in which a sealing area of a first substrate and a second substrate is provided with a sealing area cell gap maintenance portion to uniformly maintain an active area cell gap that is an internal thickness of an active area where an image is displayed, and a sealing area cell gap that is an internal thickness of a sealing area, thereby improving the uniformity of transmittance at each position of the display device.

According to one aspect of the present disclosure, a liquid crystal display device may be provided while comprising: a first substrate provided with an active area where an image is displayed, and with a nonactive area where an image is not displayed; a second substrate provided with a thin film transistor, and arranged to face the first substrate; a pixel image layer disposed between the first substrate and the second substrate; a sealing member sealing between the first substrate and the second substrate; and a sealing area cell gap maintenance portion provided in a sealing area mutually sealing the first substrate and the second substrate to maintain a sealing area cell gap, which is an internal thickness of the first substrate and the second substrate in the sealing area SA, uniformly with an active area cell gap, which is an internal thickness of the first substrate and the second substrate in the active area.

As an example, the pixel image layer disposed between the first substrate and the second substrate may comprise a liquid crystal material.

The sealing area cell gap maintenance portion may comprise: a layered sealing area cell gap maintenance portion configured in a layered structure in a direction from a surface of the first substrate of the sealing area toward the second substrate; and a column sealing area cell gap maintenance portion configured to stand in a direction from a surface of the layered sealing area cell gap maintenance portion toward the second substrate while being connected to the layered sealing area cell gap maintenance portion.

The column sealing area cell gap maintenance portion may comprise multiple sealing area cell gap maintenance-column spacers coupled to the surface of the layered sealing area cell gap maintenance portion, and the first substrate may comprise: a first base substrate; an active area color filter comprising at least one of an R color filter for displaying R (red) color, a G color filter for displaying G (green) color, and a B color filter for displaying B (blue) color in the active area; an active area black matrix provided between two active area color filters selected from the R color filter, the G color filter, and the B color filter to prevent two or more color mixtures; an active area overcoat provided on a surface of the active area color filter facing the second substrate; an active area cell gap maintenance-column spacer provided between the active area overcoat and the second substrate to uniformly maintain an internal thickness of the active area; and an active area touch column spacer coupled to a surface of the active area overcoat, and formed to be shorter than a length of the active area cell gap maintenance-column spacer, thereby preventing occurrence of spot due to pressure applied from an outside of the active area.

The layered sealing area cell gap maintenance portion may comprise: a sealing area black matrix coupled to a side of the first base substrate of the sealing area to prevent transmission of light incident from outside the second substrate; and a sealing area color filter provided as one selected from the R color filter, the G color filter, and the B color filter, and coupled to a surface of the sealing area black matrix facing the second substrate.

The layered sealing area cell gap maintenance portion may further comprise: a sealing area overcoat provided on a surface of the sealing area color filter facing the second substrate to planarize the surface of the sealing area color filter.

The first substrate may comprise a first base substrate, the nonactive area may comprise a bezel area provided on a periphery of the active area, and the liquid crystal display device may further comprise a bezel area cell gap maintenance portion provided between the first base substrate and the second substrate of the bezel area to maintain a bezel area cell gap, which is an internal thickness of the first substrate and the second substrate in the bezel area, uniformly with the active area cell gap, which is the internal thickness of the first substrate and the second substrate in the active area.

The bezel area cell gap maintenance portion may comprise: a layered bezel area cell gap maintenance portion configured in a layered structure in a direction from a surface of the first substrate of the bezel area toward the second substrate; and a column bezel area cell gap maintenance portion configured to stand in a direction from a surface of the layered bezel area cell gap maintenance portion toward the second substrate while being connected to the layered bezel area cell gap maintenance portion.

The column bezel area cell gap maintenance portion may comprise: a bezel area cell gap maintenance-column spacer coupled to a surface of the layered bezel area cell gap maintenance portion; and a bezel area touch column spacer coupled to a surface of the layered bezel area cell gap maintenance portion, and formed to be shorter than a length of the bezel area cell gap maintenance-column spacer, thereby preventing occurrence of spot due to pressure applied from an outside of the bezel area.

The first substrate may comprise: a first base substrate; an active area color filter comprising at least one of an R color filter for displaying R (red) color, a G color filter for displaying G (green) color, and a B color filter for displaying B (blue) color in the active area; an active area black matrix provided between two active area color filters selected from the R color filter, the G color filter, and the B color filter to prevent two or more color mixtures; an active area overcoat provided on a surface of the active area color filter facing the second substrate; an active area cell gap maintenance-column spacer provided between the active area overcoat and the second substrate to uniformly maintain an internal thickness of the active area; and an active area touch column spacer coupled to a surface of the active area overcoat, and formed to be shorter than a length of the active area cell gap maintenance-column spacer, thereby preventing occurrence of spot due to pressure applied from an outside of the active area.

The layered bezel area cell gap maintenance portion may comprise: a bezel area black matrix layer coupled to a side of the first base substrate of the bezel area to prevent transmission of light incident from outside the second substrate; and a bezel area color filter constituted by the B color filter and provided on a surface of the bezel area black matrix layer facing the second substrate, and the bezel area black matrix layer may comprise: a first bezel area black matrix structure provided adjacent to the active area; a second bezel area black matrix structure provided toward the sealing area while being spaced apart from the first bezel area black matrix structure; and a slit provided between the first bezel area black matrix structure and the second bezel area black matrix structure.

The layered bezel area cell gap maintenance portion may further comprise: a bezel area overcoat provided on a surface of the bezel area color filter planarizing the surface of the bezel area color filter.

According to the present disclosure, by providing a sealing area cell gap maintenance portion with a compact and effective structure to a sealing area of a first substrate and a second substrate uniformity of an active area cell gap that is an internal thickness of an active area where an image is displayed, and a sealing area cell gap that is an internal thickness of a sealing area is maintained, the uniformity of transmittance at each position of the display device may be improved.

DETAILED DESCRIPTION

Figure 1:
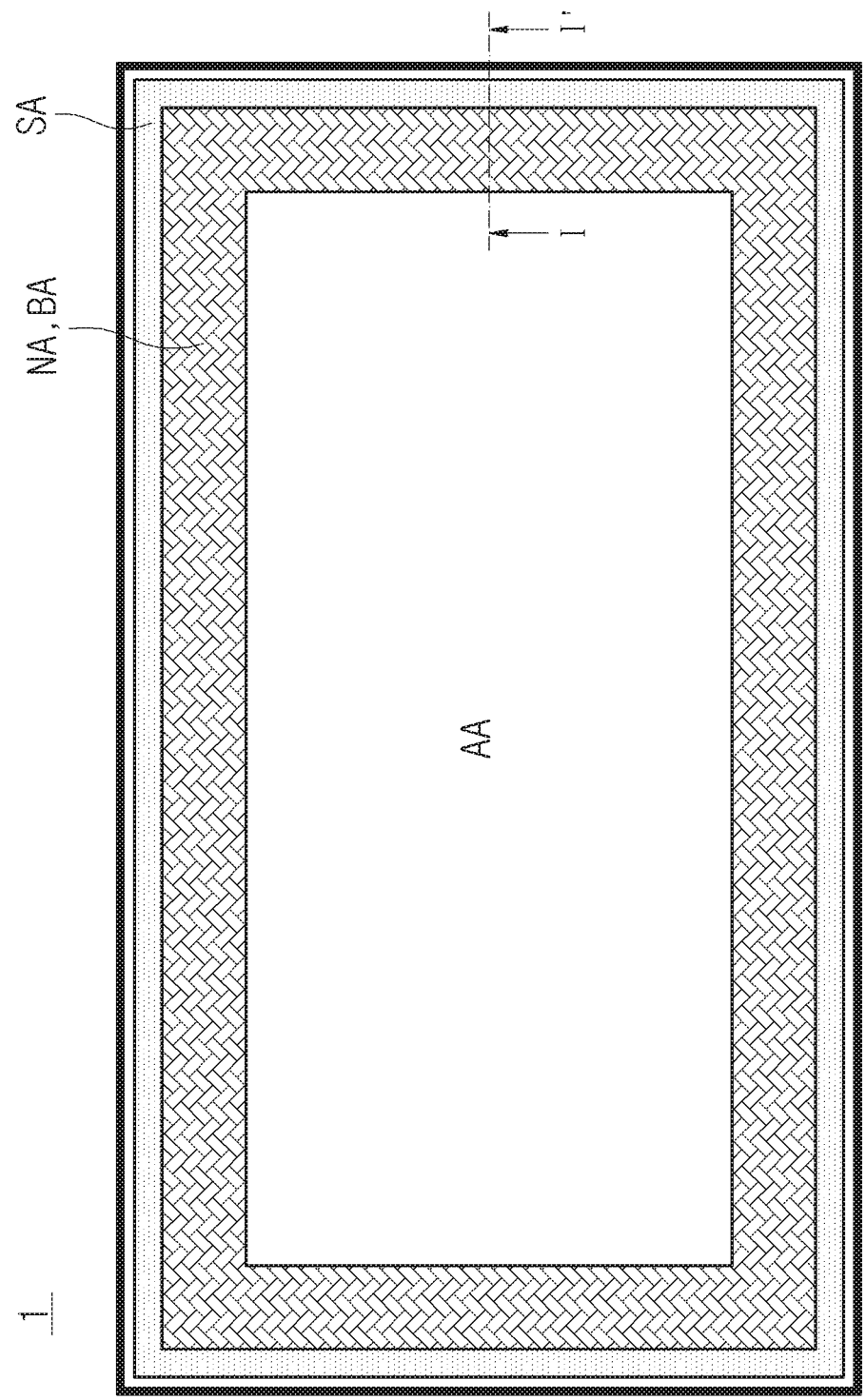
FIG. 1 is a plan view of a display device according to an embodiment of the present disclosure.

The above and other objectives, advantages and features of the present disclosure will become apparent with reference to the embodiment described in detail below with reference to the accompanying drawings.

Herein below, to aid to understanding the disclosure, a preferred embodiment of the present disclosure will be described in detail with reference to the accompanying drawings. Wherever possible, the same reference numerals will be used throughout the drawings and the description to refer to the same or like elements or parts.

For the sake of explanation, the present disclosure mainly describes a liquid crystal display device as one possible embodiment. However, it should be understood that it is not restricted as the liquid crystal display device. That is, the technical idea covers other types of display device such as organic light emitting device (OLED).

Figure 2:
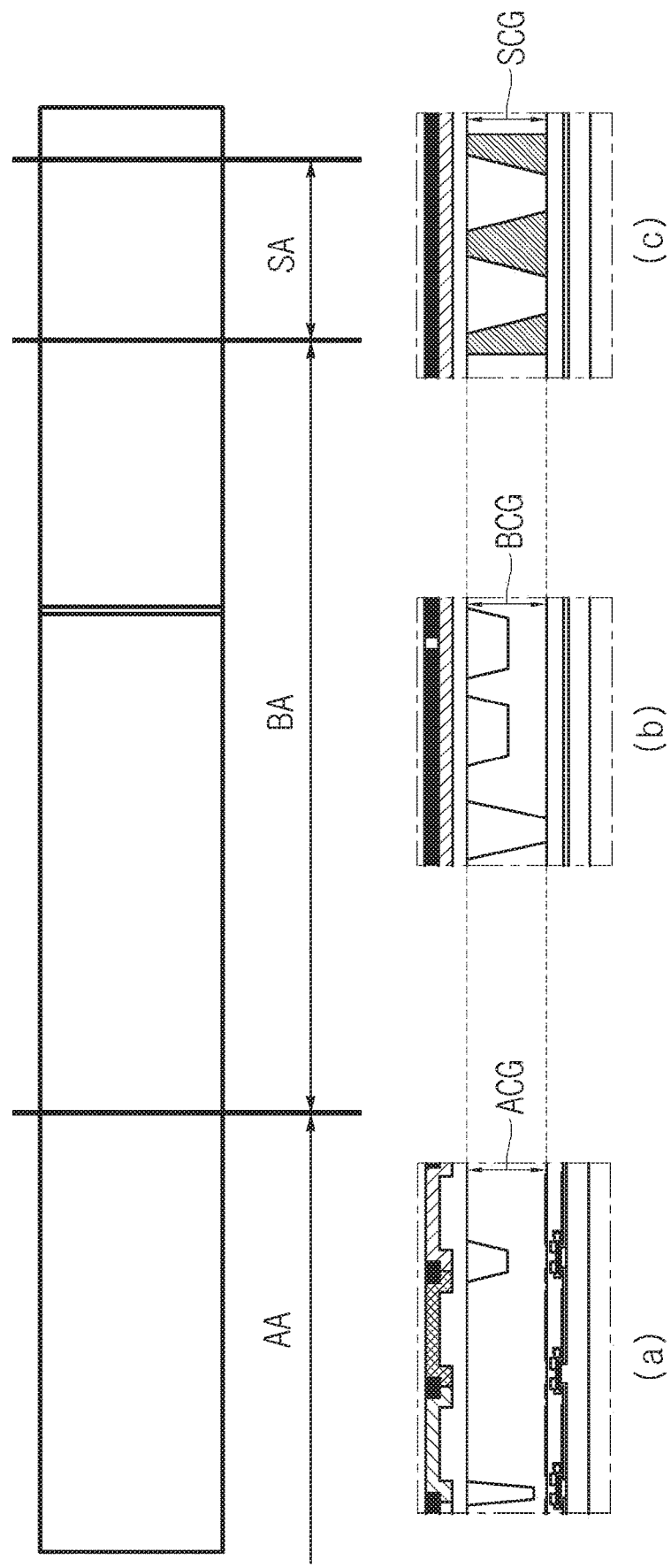
FIG. 2 is a schematic of a plan view taken along line I-I' of FIG. 1.
Figure 3:
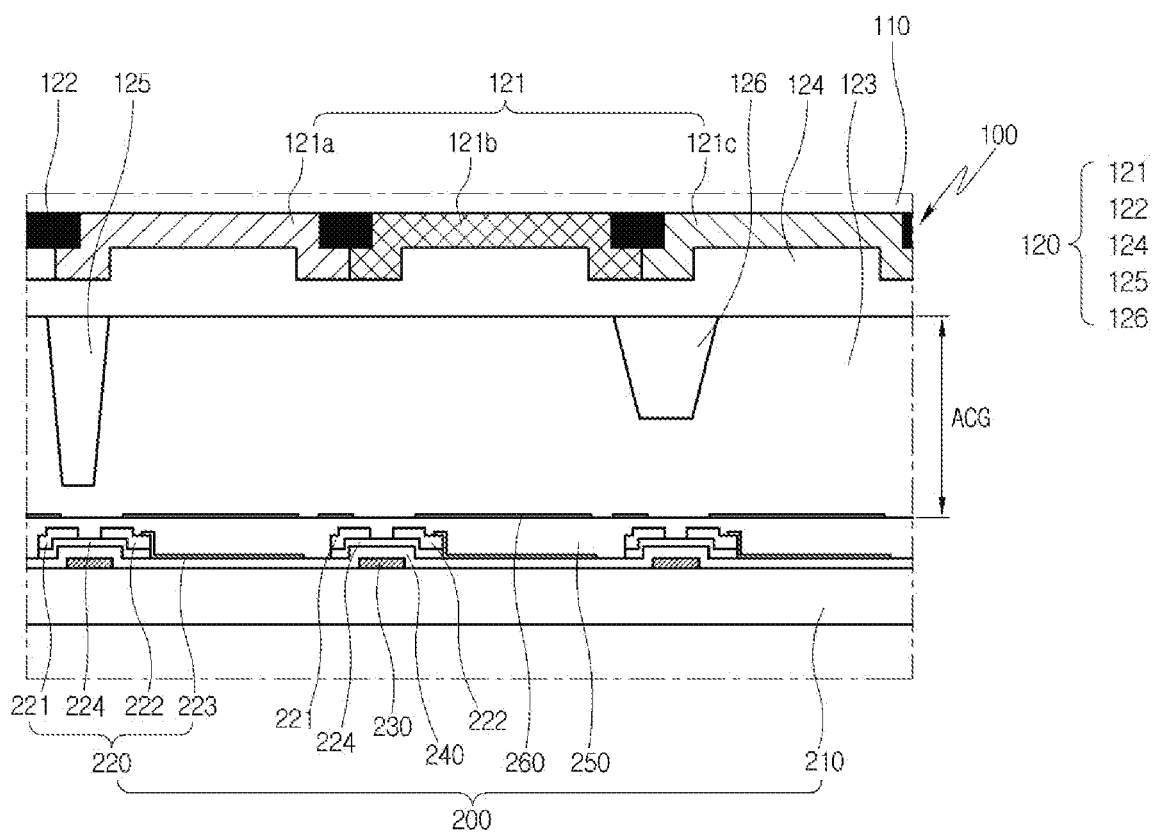
FIG. 3 is an enlarged view of area (a) of FIG. 2.
Figure 4:
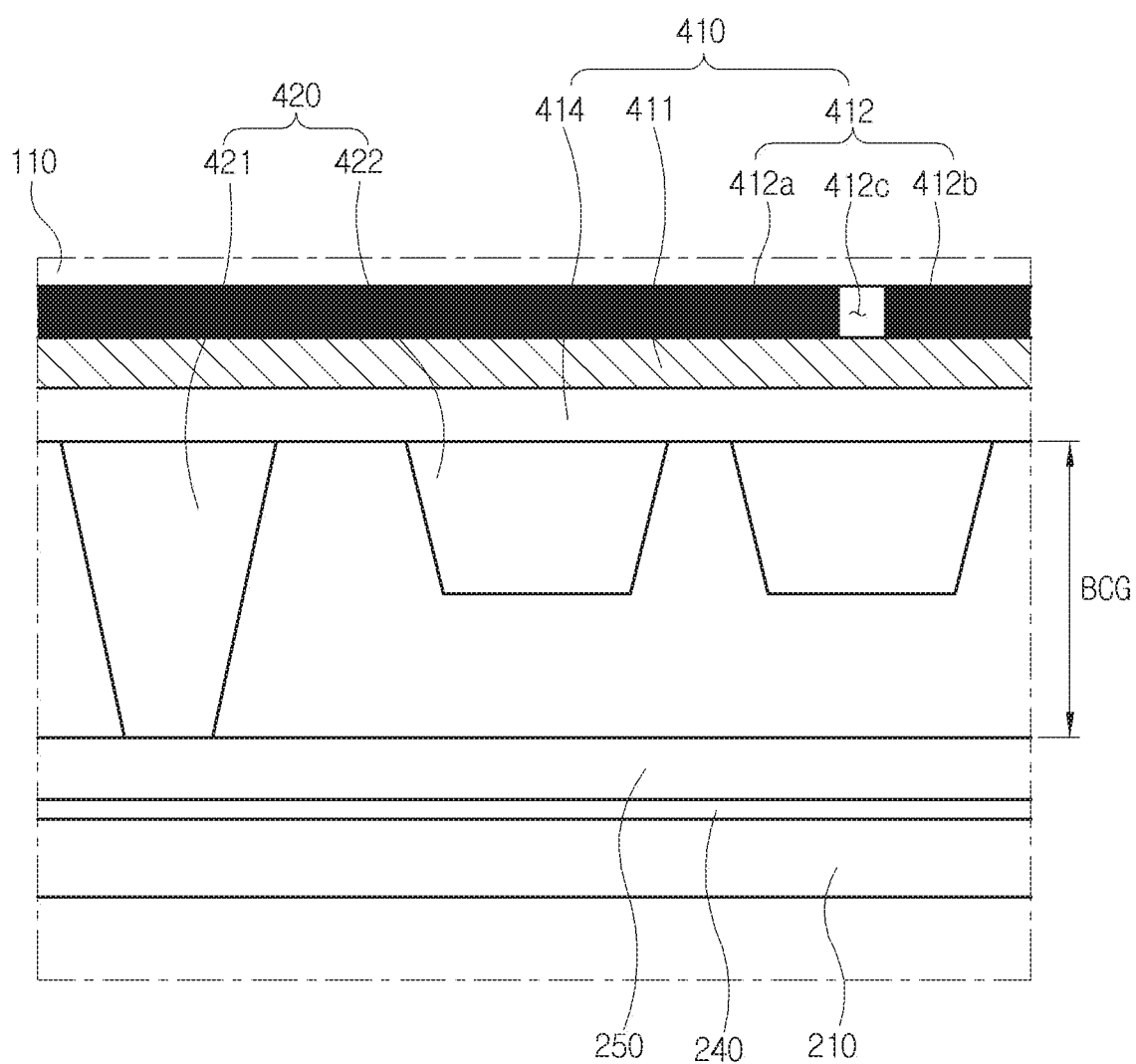
FIG. 4 is an enlarged view of area (b) of FIG. 2.
Figure 5:
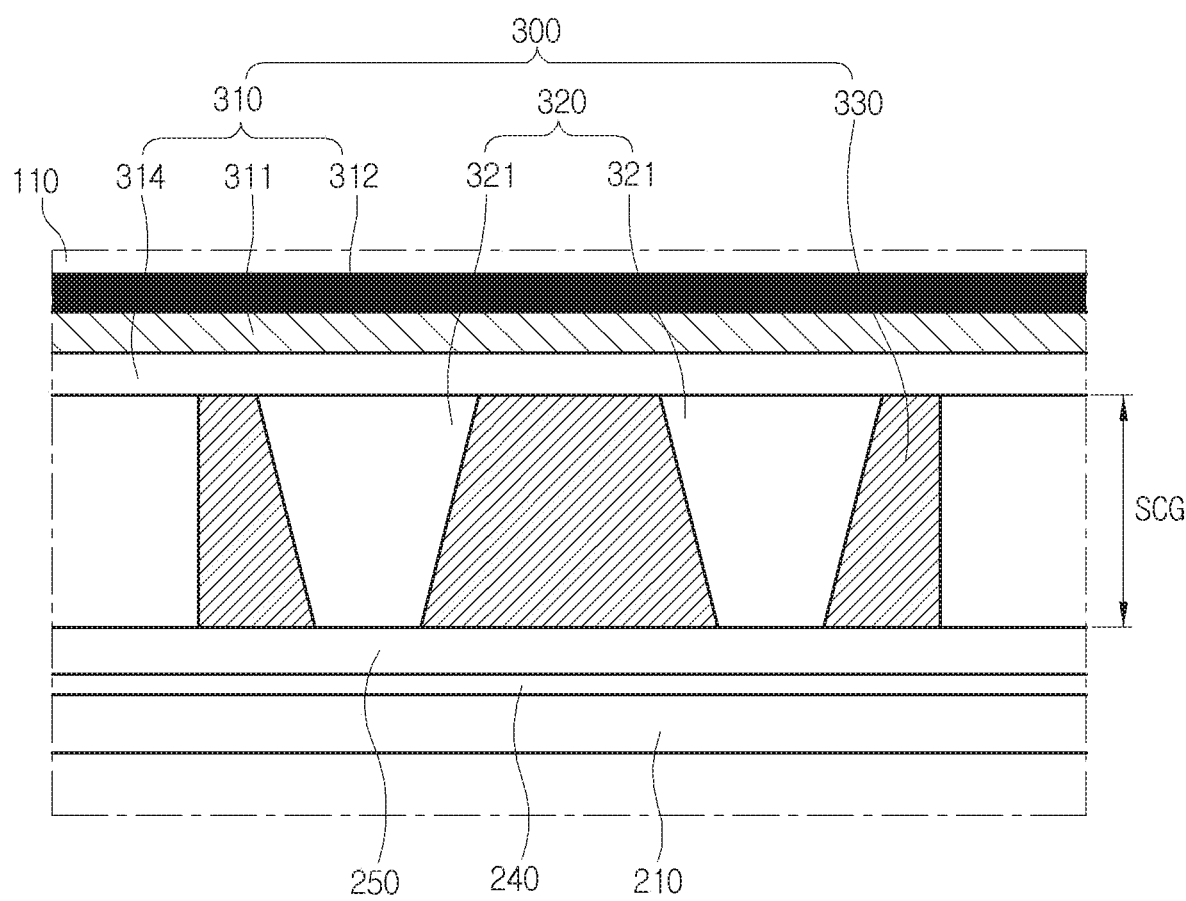
FIG. 5 is an enlarged view of area (c) of FIG. 2.

FIG. 1 is a plan view of a display device according to an embodiment of the present disclosure, FIG. 2 is a schematic side view taken along line I-I' of FIG. 1. FIG. 3 is an enlarged view of area (a) of FIG. 2, FIG. 4 is an enlarged view of area (b) of FIG. 2, and FIG. 5 is an enlarged view of area (c) of FIG. 2.

As shown in detail in the drawings, a display device 1 according to the embodiment comprises a first substrate 100, a second substrate 200, a sealing area cell gap maintenance member 300, and a bezel area cell gap maintenance region 400.

The first substrate 100 is provided with an active area AA where an image is displayed, as an area for realizing information coming into the eyes of an actual person. The first substrate 100 is further provided outside the active area AA with a nonactive area NA, where an image is not displayed, comprising a bezel area BA. Also, the first substrate 100 comprises a first base substrate 110, and a pixel display portion 120 provided on the first substrate 100 of the active area AA for displaying pixels.

The first base substrate 110 may be formed of a material such as glass or plastic capable of transmitting light. Further, the shape of the first base substrate 110 may be in the form of a plate or film. However, this embodiment does not limit the shape or material of the first base substrate 110 to the above shape or material.

The pixel display portion 120 comprises an active area color filter 121, an active area black matrix 122, an active area overcoat 124, an active area cell gap maintenance-column spacer 125, and an active area touch spacer 126.

The active area color filter 121 is connected to the first base substrate 110 of the active area AA, and comprises at least one of an R color filter 121a for displaying R (red) color, a G color filter 121b for displaying G (green) color, and a B color filter 121c for displaying B (blue) color in the active area.

For the R color filter 121a, the G color filter 121b, and the B color filter 121c according to the embodiment, a pigment method using a pigment or a dye method using a dye may be applied, and the color filter may be fabricated by a dyeing method, a dispersion method, an electrodeposition method, a printing method, or the like. The color filter is a thin film-type optical part for extracting three colors, namely, red, green, and blue on a pixel unit basis from a white light emitted from a back light source (not shown) provided at the lower portion of the second substrate 200 to realize a color in the display device 1.

The active area black matrix 122 is provided between two active area color filters 121 selected from the R color filter 121a, the G color filter 121b, and the B color filter 121c in order to prevent two or more color mixtures. The active area black matrix 122 may be formed using chromium (Cr), chromium oxide (CrOx), resin, graphite, or the like. The active area black matrix 122 allows transmission of the portion of the liquid crystal array that is abnormally driven in the region where a thin film transistor is provided by the light incident from the back light source (not shown) to be blocked at the portion of the active area color filter 121.

A pixel image layer 123 is provided in accordance with the type of the display device 1. For example, in those cases in which the display device 1 is a liquid crystal display (LCD) device, the pixel image layer 123 may comprise liquid crystal material. For another example, in those cases in which the display device 1 is an organic light emitting device, the pixel image layer 123 may comprise OLED material. As known to those skilled in the art, the pixel image layer 123 may comprise many sublayers. This disclosure mainly describes a liquid crystal display device to provide one example for understanding. However, the technical idea is not restricted to liquid crystal displays and may be applied to other types of displays, such as OLED displays.

For the LCD device, a liquid crystal material 123 is a material that is provided between the active area color filter 121 and the second substrate 200 and has a refractive index of two or more depending on the molecular alignment direction, and the liquid crystal molecule alignment is controlled by the voltage applied to a liquid crystal layer. In other words, the liquid crystal material 123 has an elongated structure in the longitudinal direction, and the molecular alignment is controlled according to the electric field applied to the liquid crystal material 123, thereby providing multiple refractive index depending on the degree of rotation of the liquid crystal material 123.

The active area overcoat 124 is formed on the surface of the active area color filter 121 facing the second substrate 200 to partition the liquid crystal material 123 and the color filter 121, is provided to planarize the R color filter 121a, the G color filter 121b, and the B color filter 121c that form the RGB pattern of the surface of the active area color filter 121, is capable of preventing liquid crystal contamination due to a pigment or a dye component, and is formed of a thermosetting acrylic resin, a polyamide resin, an epoxy resin, or the like.

The active area cell gap maintenance-column spacer 125 is provided between the active area overcoat 124 and the second substrate 200 to uniformly maintain an active area cell gap ACG, which is an internal thickness of the active area AA. As such, active area cell gap maintenance-column spacer 125 is provided between the active area overcoat 124 and the second substrate 200 to maintain the spacing there between. Meanwhile, as the material of the active area cell gap maintenance-column spacer 125 according to the embodiment, an acrylic organic material may be used, or a photosensitive organic material may be used by direct exposure and development without a separate photoresist.

The active area touch spacer 126 is coupled to the surface of the active area overcoat 124, and is formed to be shorter than the length of the active area cell gap maintenance-column spacer 125, thereby preventing occurrence of spot defect, touch defect, and gravity defect due to the pressure applied from the outside of the active area.

Meanwhile, the second substrate 200 according to the embodiment may be arranged to face the first substrate 100, and may comprise a second base substrate 210, a thin film transistor (TFT) 220, a gate electrode 230, a gate insulating film 240, a passivation film 250, and a common electrode 260.

The second base substrate 210 may be formed of a material capable of transmitting light such as glass or plastic. Further, the shape of the second base substrate 210 may be in the form of a plate or film. However, this embodiment does not limit the shape or material of the second base substrate 210.

Further, the thin film transistor (TFT) 220 may comprise a gate electrode 230, a source electrode 221, a drain electrode 222, and a semiconductor film 224. However, the scope of the present disclosure is not limited thereto, and the liquid crystal display device 1 may be of various liquid crystal driving modes such as an IPS mode, a VA mode, and a TN mode. Here, the shapes of the common electrode 260 and the pixel electrode 223 may be variously changed according to the liquid crystal driving mode by a person of ordinary skill in the art. The structure in which both the above-described pixel electrode 223 and the common electrode 260 are formed in the second substrate 200 is of an in-plane switching (IPS) mode in which the viewing angle characteristic of the liquid crystal display panel is improved, and in a twisted nematic (TN) mode liquid crystal display device, the pixel electrode 223 and the common electrode 260 may be formed on the entire surface of the first substrate 100, and the spacer structure of the present disclosure may be applied.

Turning now to FIG. 5, the sealing area cell gap maintenance region 300 is provided in a sealing area SA. The sealing area SA is an area for mutually sealing the first substrate 100 and the second substrate 200 to maintain a sealing area cell gap SCG between a sealing area overcoat 314 and the passivation film 250. This sealing area cell gap is an internal distance between the first substrate 100 and the second substrate 200 in the sealing area SA. The gap maintenance region 300 ensure that this will be uniform in distance with the active area cell gap ACG of the first substrate 100 and the second substrate 200 in the active area AA. The sealing gap region 300 comprises a layered sealing area cell gap maintenance portion 310, a column sealing area cell gap maintenance portion 320, and a sealing member 330.

Further, the layered sealing area cell gap maintenance portion 310 is formed in a layered structure in a direction from one surface of the first substrate 100 of the sealing area SA toward the second substrate 200, and comprises a sealing area color filter 311, a sealing area black matrix 312, and a sealing area overcoat 314.

Although the sealing area color filter 311 may be provided as any one color filter selected from the R color filter 121a, the G color filter 121b, and the B color filter 121c of the above-described active area color filter 121 and may be connected to a surface of the sealing area black matrix 312 facing the second substrate 200, the sealing area color filter 311 according to the embodiment is provided as the B color filter 121c with low light transmittance, thereby effectively preventing light leakage in the sealing area SA. Further, the sealing area color filter 311 is coupled to the sealing area black matrix 312 to have the same step as the part where the active area color filter 121 of the active area AA is coupled to the active area black matrix 122. Therefore, it is possible to efficiently maintain the sealing area cell gap SCG uniformly with the active area cell gap ACG.

The sealing area black matrix 312 is coupled to one side of the first base substrate 110 of the sealing area SA to prevent transmission of light incident from the back light source (not shown) provided at the outer bottom of the second substrate 200, thereby effectively preventing light leakage in the sealing area SA.

The sealing area overcoat 314 is provided on a surface of the sealing area color filter 311 facing the second substrate 200 to planarize the surface of the sealing area color filter 311, and the step of the sealing area cell gap SCG may be provided equal to the step of the active area cell gap ACG in the state where the active area color filter 121 of the active area AA is planarized by the active area overcoat 124. Therefore, it is possible to efficiently maintain the sealing area cell gap SCG uniformly with the active area cell gap ACG.

The column sealing area cell gap maintenance portion 320 is formed to stand in a direction from a surface of the layered sealing area cell gap maintenance portion 310 toward the second substrate 200 while being connected to the layered sealing area cell gap maintenance portion 310, and comprises multiple sealing area cell gap maintenance-column spacers 321.

The sealing area cell gap maintenance-column spacer 321 is provided between the first and second substrates 100 and 200 of the sealing area SA to maintain the spacing there between. Thus, the sealing area cell gap maintenance-column spacer 321 is capable of efficiently maintaining the sealing area cell gap SCG forming the spacing between the first and second substrates 100 and 200 of the sealing area SA uniformly with the active area cell gap ACG in consideration of the variation of the optical characteristics due to the temperature change of the liquid crystal material 123 of the active area AA.

The sealing member 330 according to the embodiment fills the gap between the outer surface of the sealing area cell gap maintenance-column spacers 321 and the first and second substrates 100 and 200 of the sealing area SA to seal the first and second substrates 100 and 200. In other words, it is possible to prevent the liquid crystal material 123 from leaking outside when the liquid crystal material 123 expands between the first and second substrates 100 and 200 in accordance with an external temperature change.

As shown in FIG. 4, Meanwhile, the bezel area cell gap maintenance region 400 according to the embodiment is provided between the first and second substrates 100 and 200 of the bezel area BA to maintain the bezel area cell gap BCG, which is an internal distance of the first and second substrates 100 and 200 from each other in the bezel area BA, to be the same distance as the active area cell gap ACG. Thus, the sealing area cell gap SCG, the active area cell gap ACG, and the bezel area cell gap BCG according to the embodiment may be provided within a predetermined cell gap range, and the cell gap range according to the embodiment is configured such that the maximum variation of the cell gap comprising the sealing area cell gap SCG, the active area cell gap ACG, and the bezel area cell gap BCG is kept to a low value. In one embodiment, it is within the range of 2.8 μm to 0.029 μm which is the reference cell gap thickness. However, the scope of the present disclosure is not limited thereto, and the cell gap range of the various areas may be determined differently if necessary.

The bezel area cell gap maintenance region 400 comprises a layered bezel area cell gap maintenance portion 410, and a column bezel area cell gap maintenance portion 420.

The layered bezel area cell gap maintenance portion 410 is formed in a layered structure in a direction from one surface of the first substrate 100 of the bezel area BA toward the second substrate 200, and comprises a bezel area color filter 411, a bezel area black matrix layer 412, and a bezel area overcoat 414.

Meanwhile, the bezel area color filter 411 according to the embodiment is the B color filter 121c with low light transmittance provided on a surface of the bezel area black matrix layer 412 facing the second substrate 200 to effectively prevent transmission of light incident from the back light source (not shown) outside the second substrate 200, thereby preventing light leakage in the bezel area BA.

Further, the bezel area black matrix layer 412 is coupled to one side of the first base substrate 110 of the bezel area BA to prevent transmission of light incident from the back light source (not shown) outside the second substrate 200, thereby increasing the prevention rate of light leakage in the bezel area BA, and comprises a first bezel area black matrix structure 412a provided adjacent to the active area AA, a second bezel area black matrix structure 412b provided toward the sealing area SA while being spaced apart from the first bezel area black matrix structure 412a, and a slit 412c provided between the first bezel area black matrix structure 412a and the second bezel area black matrix structure 412b.

The slit 412c may prevent noise such as static electricity from the outside from being introduced into the active area AA, and may be configured in a double slit structure.

As described above, the bezel area BA according to the embodiment is provided with the slit 412c to prevent noise such as static electricity from the outside from being introduced into the active area AA, and also provided with the B color filter 121c having low light transmittance and with the bezel area black matrix layer 412 to prevent transmission of light incident from the back light source (not shown) outside the second substrate 200, thereby effectively preventing light leakage in the bezel area BA.

The bezel area overcoat 414 is provided on a surface of the bezel area color filter 411 facing the second substrate 200 to planarize the surface of the bezel area color filter. Thus, the step of the bezel area cell gap BCG may be provided equal to the step of the sealing area cell gap SCG in the state where the active area color filter 121 of the active area AA is planarized by the active area overcoat 124. Therefore, it is possible to efficiently maintain the bezel area cell gap BCG uniformly with the sealing area cell gap SCG and the active area cell gap ACG.

The column bezel area cell gap maintenance portion 420 is provided to stand in a direction from a surface of the layered bezel area cell gap maintenance portion 410 toward the second substrate 200 while being connected to the layered bezel area cell gap maintenance portion 410, and comprises a bezel area cell gap maintenance-column spacer 421, and a bezel area touch column spacer 422.

The bezel area cell gap maintenance-column spacer 421 is coupled to a surface of the layered bezel area cell gap maintenance portion 410, and the bezel area touch column spacer 422 is coupled to the surface of the layered bezel area cell gap maintenance portion 410 and is formed to have a length shorter than that of the bezel area cell gap maintenance-column spacer 421, thereby preventing occurrence of spot due to the pressure applied from the outside of the bezel area BA.

Hereinafter, the effect of the liquid crystal display device configured as described above will be described.

As described above, it is possible to effectively maintain the sealing area cell gap SCG and the bezel area cell gap BCG uniformly with the active area cell gap ACG.

Figure 6:
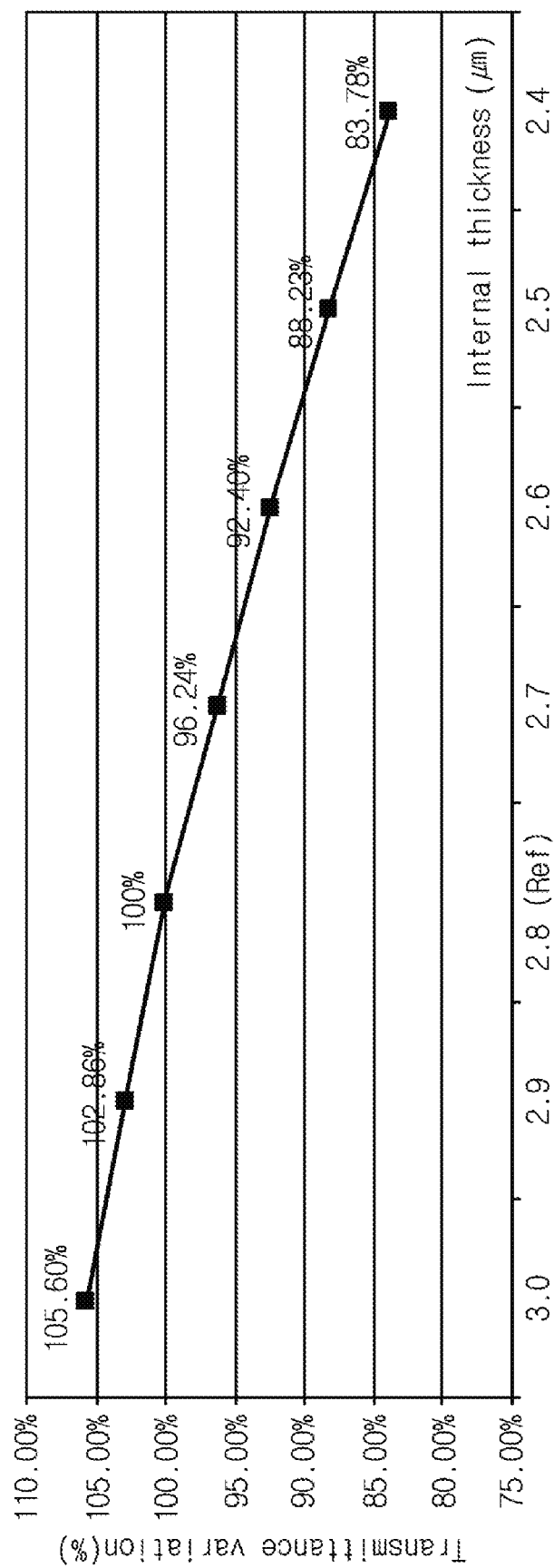
FIG. 6 is a graph showing transmittance variation according to internal thickness of a display device.
Figure 7:
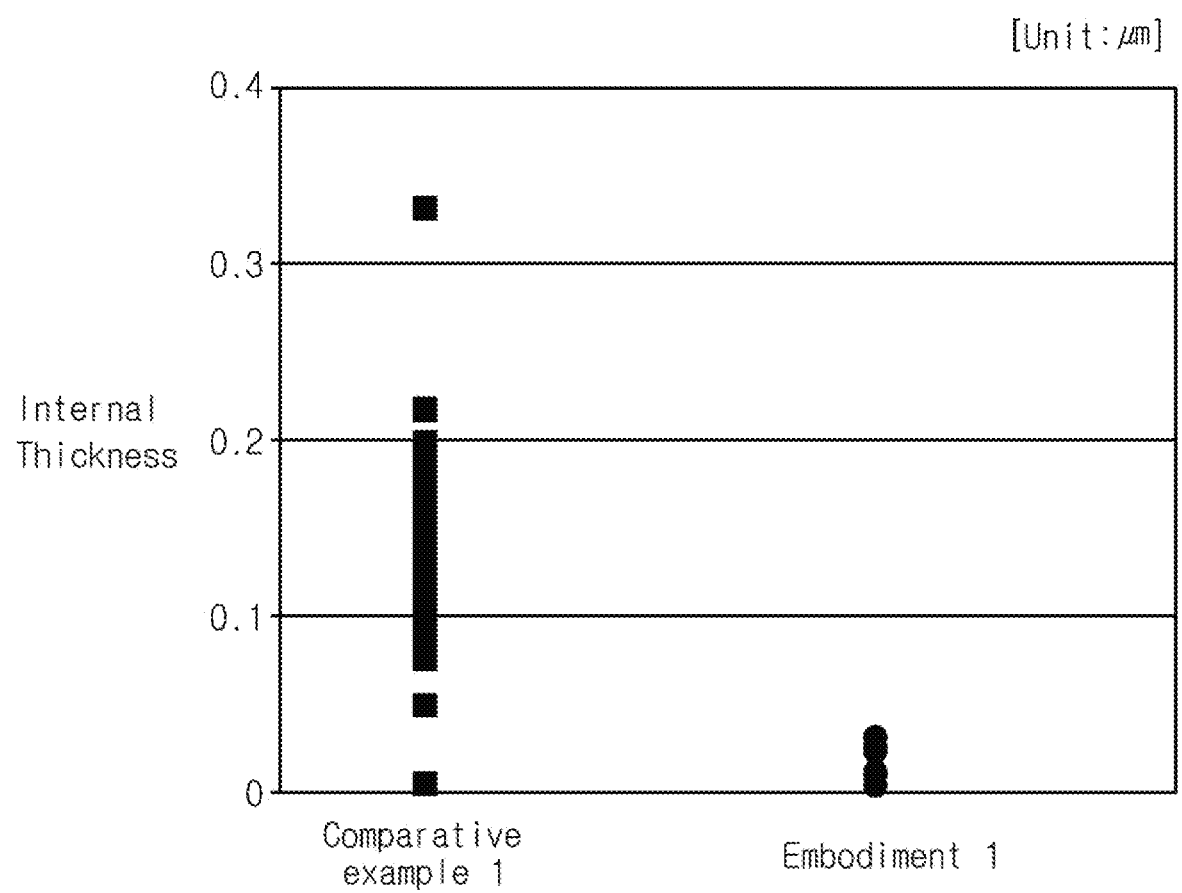
FIG. 7 is a graph comparing internal thickness variation of a display device according to comparative example 1 and internal thickness variation of a display device according to an embodiment of the present disclosure.
Figure 8:
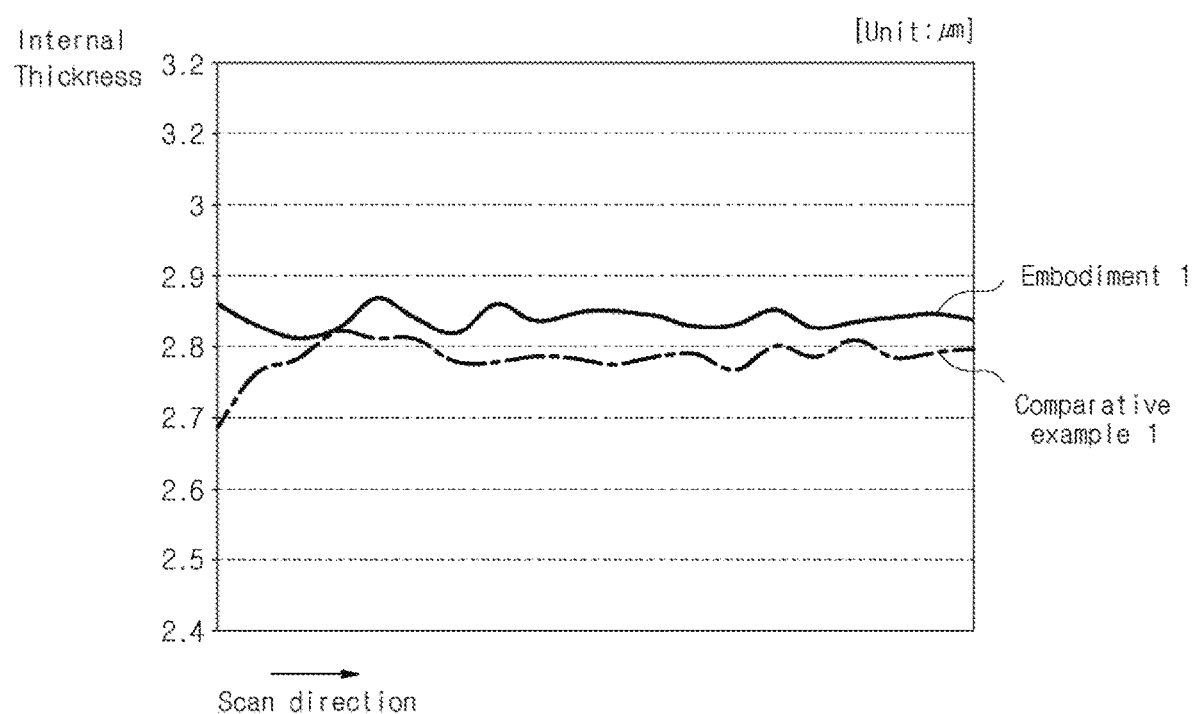
FIG. 8 is a graph showing internal thickness variation according to a scan direction of the display device according to the comparative example 1 and the display device according to an embodiment of the present disclosure of FIG. 7.

FIG. 6 is a graph showing transmittance variation according to internal thickness of a liquid crystal display device, FIG. 7 is a graph comparing internal thickness variation of a liquid crystal display device according to comparative example 1 and internal thickness variation of a liquid crystal display device according to an embodiment of the present disclosure, and FIG. 8 is a graph showing internal thickness variation according to a scan direction of the liquid crystal display device according to the comparative example 1 and the liquid crystal display device according to the embodiment of the present disclosure of FIG. 7.

The following Equation 1 is the transmittance variation relation according to internal thickness (cell gap) of the liquid crystal display device of FIG. 6.

$$T = \frac{1}{2}\sin^2(2\alpha)\sin^2\left(\frac{\pi \Delta nd}{\lambda}\right) \quad \text{Equation 1}$$

Herein, T is the transmittance, α is the rotation angle of the liquid crystal material 123, n is the refractive index, d is the internal thickness (cell gap) of the liquid crystal display device, and λ is the wavelength of the incident light. In Equation 1, a predetermined fixed constant is used for α, n, and λ, and the transmittance variation according to d (cell gap) change is measured.

As shown in detail in FIG. 6, the transmittance was increased by 5.6% when the internal gap (cell gap) was increased by 0.2 μm compared to the reference thickness providing the internal gap (cell gap) of 2.8 μm, and the transmittance was decreased to 83.78% when the internal gap (cell gap) was decreased by 0.4 μm compared to the reference thickness (2.8 μm) by forming the internal thickness (cell gap) of 2.4 μm. Therefore, maintaining the uniformity of the internal gap (cell gap) maintains a constant transmittance.

Meanwhile, the following Table 1 shows the maximum (Max), minimum (Min) and average (Avg.) cell gap variations of comparative example 1 and embodiment 1 of the present disclosure shown in FIG. 7. The cell gap variations in Table 1 indicate the maximum and minimum cell gap variations among the measured values comprising the sealing area cell gap SCG, the active area cell gap ACG, and the bezel area cell gap BAG.

TABLE 1

|  | Min | Max | Avg. |
| --- | --- | --- | --- |
| Comparative example 1 | 0.003 | 0.330 | 0.136 |
| Embodiment 1 | 0.004 | 0.029 | 0.014 |

(Unit: μm)

In the liquid crystal display device 1 according to the embodiment, the difference between the maximum internal thickness variation and the minimum internal thickness variation is set to 0.025 μm on average. As such, it can be seen that the cell gap difference of the sealing area cell gap SCG, the active area cell gap ACG, and the bezel area cell gap BAG of the liquid crystal display device 1 according to the embodiment is significantly reduced compared to the difference between the maximum internal thickness and the minimum internal thickness variation of 0.327 μm based on the reference cell gap thickness of 2.8 μm of comparative example 1, which is a conventional liquid crystal display device without having configurations of the embodiment.

As described above, the liquid crystal display device 1 according to the embodiment is configured to uniformly maintain the sealing area cell gap SCG, the active area cell gap ACG, and the bezel area cell gap BAG, so that the difference between the maximum cell gap and the minimum cell gap variations is within 0.029 μm, and the transmittance variation is 1% or less.

According to the embodiment having the structure and effect as described above, a sealing area of a first substrate and a second substrate is provided with a sealing area cell gap maintenance portion having a compact and effective structure to uniformly maintain an active area cell gap, which is an internal thickness of an active area where an image is displayed, and a sealing area cell gap, which is an internal thickness of a sealing area.

Although the disclosure is described with reference to specific items such as specific structural elements, to merely some embodiments, and to drawings, such specific details disclosed herein are merely representative for purposes of helping more comprehensive understanding of the present disclosure. The present disclosure, however, is not limited to only the example embodiments set forth herein, and those skilled in the art will appreciate that the present disclosure can be embodied in many alternate forms.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a first substrate having an active area where an image is displayed, a nonactive area where an image is not displayed, and a sealing area;
a second substrate having a thin film transistor and arranged to face the first substrate;
a pixel image layer disposed between the first substrate and the second substrate in the active area;
a sealing member sealing between the first substrate and the second substrate in the sealing area; and
a sealing area cell gap maintenance region provided in the sealing area to maintain a sealing area cell gap distance that is an internal distance between the first substrate and the second substrate in the sealing area as the same distance as an active area cell gap that is an internal distance between the first substrate and the second substrate in the active area,
wherein, in the active area, the display device further comprises:
a plurality of active area color filters disposed on a surface of a first base substrate facing the second substrate;
a plurality of active area black matrixes disposed on the surface of the first base substrate between two adjacent active area color filters, wherein at least part of the two adjacent active area color filters cover the active area black matrix;
an active area overcoat disposed on the plurality of active area color filters; and
an active area cell gap maintenance-column spacer disposed on a surface of the active area overcoat where an active area black matrix, an active area color filter, and the active area overcoat are stacked,
wherein the sealing area cell gap maintenance region comprises:
a layered sealing area cell gap maintenance portion disposed on the surface of the first base substrate; and
a sealing area cell gap maintenance-column spacer disposed on a surface of the layered sealing area cell gap maintenance portion facing the second substrate;
wherein the layered sealing area cell gap maintenance portion comprises:
a sealing area black matrix disposed on the surface of the first base substrate;
a sealing area color filter disposed on the sealing area black matrix; and
a sealing area overcoat disposed on the sealing area color filter; and
wherein the sealing area cell gap distance and the active area cell gap are uniformly maintained by the sealing area cell gap maintenance region.

2. The display device of claim 1, wherein the pixel image layer disposed between the first substrate and the second substrate comprises a liquid crystal material.

3. The display device of claim 1, wherein the pixel image layer disposed between the first substrate and the second substrate comprises an organic light emitting diode.

4. The display device of claim 1,
wherein the plurality of active area color filters includes at least one of an R color filter for displaying R (red) color, a G color filter for displaying G (green) color, and a B color filter for displaying B (blue) color in the active area;
wherein the plurality of active area black matrixes are provided between the adjacent two active area color filters selected from the R color filter, the G color filter, and the B color filter to prevent two or more color mixtures;
wherein the active area cell gap maintenance-column spacer provided between the active area overcoat and the second substrate which uniformly maintains an internal thickness of the active area; and
wherein the display device further comprises:
an active area touch column spacer disposed on the surface of the active area overcoat, and formed to be shorter than a length of the active area cell gap maintenance-column spacer, thereby preventing an occurrence of spots due to pressure applied from an outside of the active area.

5. The display device of claim 1,
wherein the active area cell gap maintenance-column spacer has a tapered shape with respect to the surface of the active area overcoat, and
wherein the sealing area cell gap maintenance-column spacer has the tapered shape with respect to a surface of the layered bezel area cell gap maintenance portion.

6. The display device of claim 1,
wherein the nonactive area comprises a bezel area provided on a periphery of the active area, and
the display device further comprises a bezel area cell gap maintenance region provided between the first base substrate and the second substrate of the bezel area to maintain a bezel area cell gap, which is an internal distance between the first substrate and the second substrate in the bezel area, uniformly with the active area cell gap, which is the internal distance of the first substrate and the second substrate in the active area.

7. The display device of claim 6, wherein the bezel area cell gap maintenance region comprises:
a layered bezel area cell gap maintenance portion disposed on the surface of the first base substrate facing the second substrate and formed in a layered structure in a direction from the surface of the first base substrate of the bezel area toward the second substrate; and
a bezel area cell gap maintenance-column spacer disposed on a surface of the layered bezel area cell gap maintenance portion.

8. The display device of claim 7, wherein the bezel area cell gap maintenance region further comprises:
a bezel area touch column spacer disposed on the surface of the layered bezel area cell gap maintenance portion, and formed to be shorter than a length of the bezel area cell gap maintenance-column spacer, thereby preventing an occurrence of spots due to pressure applied from an outside of the bezel area.

9. The display device of claim 7,
wherein the bezel area cell gap maintenance-column spacer has a tapered shape with respect to the surface of the layered bezel area cell gap maintenance portion.

10. The display device of claim 7, wherein the layered bezel area cell gap maintenance portion comprises:

a bezel area black matrix layer disposed on a side of the first base substrate of the bezel area to prevent transmission of light incident from outside the second substrate; and
a bezel area color filter disposed on a surface of the bezel area black matrix layer facing the second substrate, and
wherein the bezel area black matrix layer comprises:
a first bezel area black matrix structure provided adjacent to the active area;
a second bezel area black matrix structure provided adjacent to the sealing area while being spaced apart from the first bezel area black matrix structure; and
a slit provided between the first bezel area black matrix structure and the second bezel area black matrix structure.

11. The display device of claim 10, wherein the layered bezel area cell gap maintenance portion further comprises:
a bezel area overcoat disposed on a surface of the bezel area color filter facing the second substrate to planarize the surface of the bezel area color filter.

* * * * *